US009343237B2

(12) United States Patent
Cho et al.

(10) Patent No.: US 9,343,237 B2
(45) Date of Patent: May 17, 2016

(54) VERTICAL METAL INSULATOR METAL CAPACITOR

(71) Applicant: TAIWAN SEMICONDUCTOR MANUFACTURING COMPANY, LTD., Hsinchu (TW)

(72) Inventors: Lan-Chou Cho, Hsinchu (TW); Chewn-Pu Jou, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/600,777

(22) Filed: Jan. 20, 2015

(65) Prior Publication Data
US 2015/0131204 A1  May 14, 2015

Related U.S. Application Data

(60) Continuation-in-part of application No. 14/337,530, filed on Jul. 22, 2014, now Pat. No. 9,006,061, which is a division of application No. 12/825,605, filed on Jun. 29, 2010, now Pat. No. 8,810,002.

(60) Provisional application No. 61/259,787, filed on Nov. 10, 2009.

(51) Int. Cl.
*H01G 4/30*    (2006.01)
*H01G 4/38*    (2006.01)
(Continued)

(52) U.S. Cl.
CPC ............... *H01G 4/306* (2013.01); *H01G 4/005* (2013.01); *H01G 4/38* (2013.01); *H01L 23/5223* (2013.01); *H01L 28/60* (2013.01); H01L 27/0805 (2013.01); H01L 2924/0002 (2013.01)

(58) Field of Classification Search
CPC ...... H01L 28/60; H01L 23/5223; H01G 4/30; H01G 4/005; H01G 4/306; H01G 13/00
USPC .................... 257/309; 361/330; 438/244, 387
See application file for complete search history.

(56) References Cited

U.S. PATENT DOCUMENTS 5,245,505 A    9/1993  Shiga et al.
5,583,359 A   12/1996  Ng et al.
(Continued)

OTHER PUBLICATIONS

OA dated Apr. 1, 2012 from corresponding application No. CN 201010546188.1.
(Continued)

*Primary Examiner* — Earl Taylor
(74) *Attorney, Agent, or Firm* — Hauptman Ham, LLP

(57) ABSTRACT

A capacitor structure includes at least two capacitors. A first electrode includes a bottom conductive plane and first vertical conductive structures. The bottom conductive plane is disposed over a substrate. The bottom conductive plane has a first area and a first shape. At least two second electrodes include top conductive planes and second vertical conductive structures. A combined area of the top conductive planes and a gap area between adjacent top conductive planes has a second area and a second shape. The first area and the second area are about the same and the first shape and the second shape are about the same. An insulating structure is disposed between the first electrode and the second electrodes. The first vertical conductive structures and the second vertical conductive structures are interlaced with each other. The capacitors share the bottom conductive plane and have separate top conductive planes.

20 Claims, 9 Drawing Sheets

(51) Int. Cl.
*H01G 4/005* (2006.01)
*H01L 23/522* (2006.01)
*H01L 49/02* (2006.01)
*H01L 27/08* (2006.01)

(56) References Cited

U.S. PATENT DOCUMENTS

| | | |
|---|---|---|
| 6,297,524 B1 | 10/2001 | Vathulya et al. |
| 6,329,234 B1 | 12/2001 | Ma et al. |
| 6,410,954 B1 | 6/2002 | Sowlati et al. |
| 6,441,419 B1 | 8/2002 | Johnson et al. |
| 6,524,940 B2 | 2/2003 | Verhaverbeke et al. |
| 6,570,210 B1 | 5/2003 | Sowlati et al. |
| 6,635,916 B2 | 10/2003 | Aton |
| 6,740,922 B2 | 5/2004 | Jones et al. |
| 6,743,671 B2 | 6/2004 | Hu et al. |
| 6,746,914 B2 | 6/2004 | Kai et al. |
| 6,822,312 B2 | 11/2004 | Sowlati et al. |
| 6,897,505 B2 | 5/2005 | Aton |
| 6,974,994 B1 | 12/2005 | Kuo et al. |
| 7,180,160 B2 | 2/2007 | Ferrant et al. |
| 7,187,015 B2 | 3/2007 | Tsau |
| 7,298,001 B1 | 11/2007 | Liu et al. |
| 7,348,624 B2 | 3/2008 | Sakaguchi et al. |
| 7,385,241 B2 | 6/2008 | Choi |
| 7,446,390 B2 | 11/2008 | Okuda et al. |
| 7,466,534 B2 | 12/2008 | Chinthakindi |
| 7,485,912 B2 | 2/2009 | Wang |
| 7,485,914 B2 | 2/2009 | Huang et al. |
| 7,518,850 B2 | 4/2009 | Kim et al. |
| 7,551,421 B2 | 6/2009 | Thompson et al. |
| 7,579,643 B2 | 8/2009 | Oh et al. |
| 7,635,887 B2 | 12/2009 | Steltenpohl |
| 7,643,268 B2 | 1/2010 | Chinthakindi |
| 7,662,695 B2 | 2/2010 | Choi |
| 7,663,175 B2 | 2/2010 | Komura et al. |
| 7,667,256 B2 | 2/2010 | Hommel et al. |
| 7,714,371 B2 | 5/2010 | Paul et al. |
| 7,741,670 B2 | 6/2010 | Pan |
| 7,768,054 B2 | 8/2010 | Benetik et al. |
| 7,768,055 B2 | 8/2010 | Chinthakindi et al. |
| 7,859,825 B2 | 12/2010 | Kim et al. |
| 7,863,662 B2 | 1/2011 | Sato et al. |
| 7,866,015 B2 | 1/2011 | Chinthakindi |
| 8,134,195 B2 | 3/2012 | Lee et al. |
| 8,138,539 B2 | 3/2012 | Barth et al. |
| 8,169,014 B2 | 5/2012 | Chen et al. |
| 8,207,567 B2 | 6/2012 | Chin et al. |
| 8,258,600 B2 | 9/2012 | Sugisaki et al. |
| 2002/0047154 A1 | 4/2002 | Sowlati et al. |
| 2003/0211731 A1 | 11/2003 | Kai et al. |
| 2004/0138050 A1 | 7/2004 | Wang et al. |
| 2004/0164339 A1 | 8/2004 | Felsner et al. |
| 2005/0133848 A1 | 6/2005 | Rotella |
| 2006/0086965 A1 | 4/2006 | Sakaguchi et al. |
| 2007/0071052 A1 | 3/2007 | Hommel et al. |
| 2008/0197399 A1 | 8/2008 | Hsu et al. |
| 2009/0141424 A1 | 6/2009 | Barth et al. |
| 2010/0012989 A1 | 1/2010 | Lee et al. |
| 2011/0108950 A1 | 5/2011 | Jou et al. |

OTHER PUBLICATIONS

Wang, "Chemical Vapor Deposition of Thin Films for ULSI Interconnect Metallization, Disertation," http:/letd.lsu.edu/docs/available/etd-04042005-171306/unrestricted/Wang_dis.pdf, May 2005.

202

Form a first electrode of the capacitor over a substrate, where the first electrode includes a bottom conductive plane and a plurality of first vertical conductive structures

204

Form an insulating structure over the first electrode

206

Form a second electrode of the capacitor over the insulating structure, where the second electrode includes a top conductive plane and a plurality of second vertical conductive structures, and the first vertical structures and the second vertical structures are interlaced with each other.

Form a first electrode over a substrate, wherein the first electrode includes a bottom conductive plane and first vertical conductive structures on the bottom conductive plane, and the bottom conductive plane has a first area and a first shape

704

Form an insulating structure over the first electrode.

706

Form at least two second electrodes over the insulating structure, wherein the at least two second electrodes include at least two top conductive planes and second vertical conductive structures under the at least two top conductive planes, wherein a combined area of the top conductive planes and a horizontal gap area between adjacent top conductive planes has a second area and a second shape. The first area and the second area are about the same and the first shape and the second shape are about the same, and the plurality of first vertical conductive structures and the plurality of second vertical conductive structures are interlaced with each other.

Form at least two first electrodes over a substrate over a substrate, wherein the at least two first electrodes include at least two bottom conductive planes and first vertical conductive structures on the at least two bottom conductive planes, wherein a combined area of the bottom conductive planes and a horizontal gap area between adjacent bottom conductive planes has a first area and a first shape.

904

Form an insulating structure over the first electrodes.

906

Form a second electrode over the insulating structure, wherein the second electrode includes a top conductive plane and second vertical conductive structures under the top conductive plane, wherein the top conductive plane has a second area and a second shape. The first area and the second area are about the same and the first shape and the second shape are about the same, and the first vertical conductive structures and the second vertical conductive structures are interlaced with each other.

VERTICAL METAL INSULATOR METAL CAPACITOR

PRIORITY CLAIM

The present application is a continuation-in-part of U.S. application Ser. No. 14/337,530, filed on Jul. 22, 2014, which is a divisional and claims priority of U.S. application Ser. No. 12/825,605, filed on Jun. 29, 2010, which claims priority of U.S. Provisional Patent Application No. 61/259,787, filed on Nov. 10, 2009, which are incorporated herein by reference in their entireties.

TECHNICAL FIELD

The present disclosure relates generally to integrated circuits, and more particularly, to vertical metal-insulator-metal (MIM) capacitors.

BACKGROUND

Capacitors are widely used in integrated circuits. The capacitance of a capacitor is proportional to the capacitor area and the dielectric constant (k) of the insulation layer, and is inversely proportional to the thickness of the insulation layer. Therefore, to increase the capacitance, it is preferable to increase the area and k value and to reduce the thickness of the insulation layer.

A problem associated with the increased area is that a greater chip area is required. Conventional metal-insulator-metal (MIM) capacitors in integrated circuits have various horizontal comb structures. The horizontal structure capacitance correlates with inter-metal layer thickness. However, the thickness of an inter-metal layer is very difficult to control. This results in high variation of MIM capacitance in production for a target value. Accordingly, new methods and structures are desired for MIM capacitors.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 2 illustrates an exemplary flow chart of a method for fabricating a vertical capacitor in an integrated circuit in accordance with one or more embodiments.

FIG. 7 is an exemplary flow chart of a method for fabricating the capacitor structure in FIG. 3A in accordance with one or more embodiments;

FIG. 9 is an exemplary flow chart of a method for fabricating the capacitor structure in FIG. 8A in accordance with one or more embodiments.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the invention.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
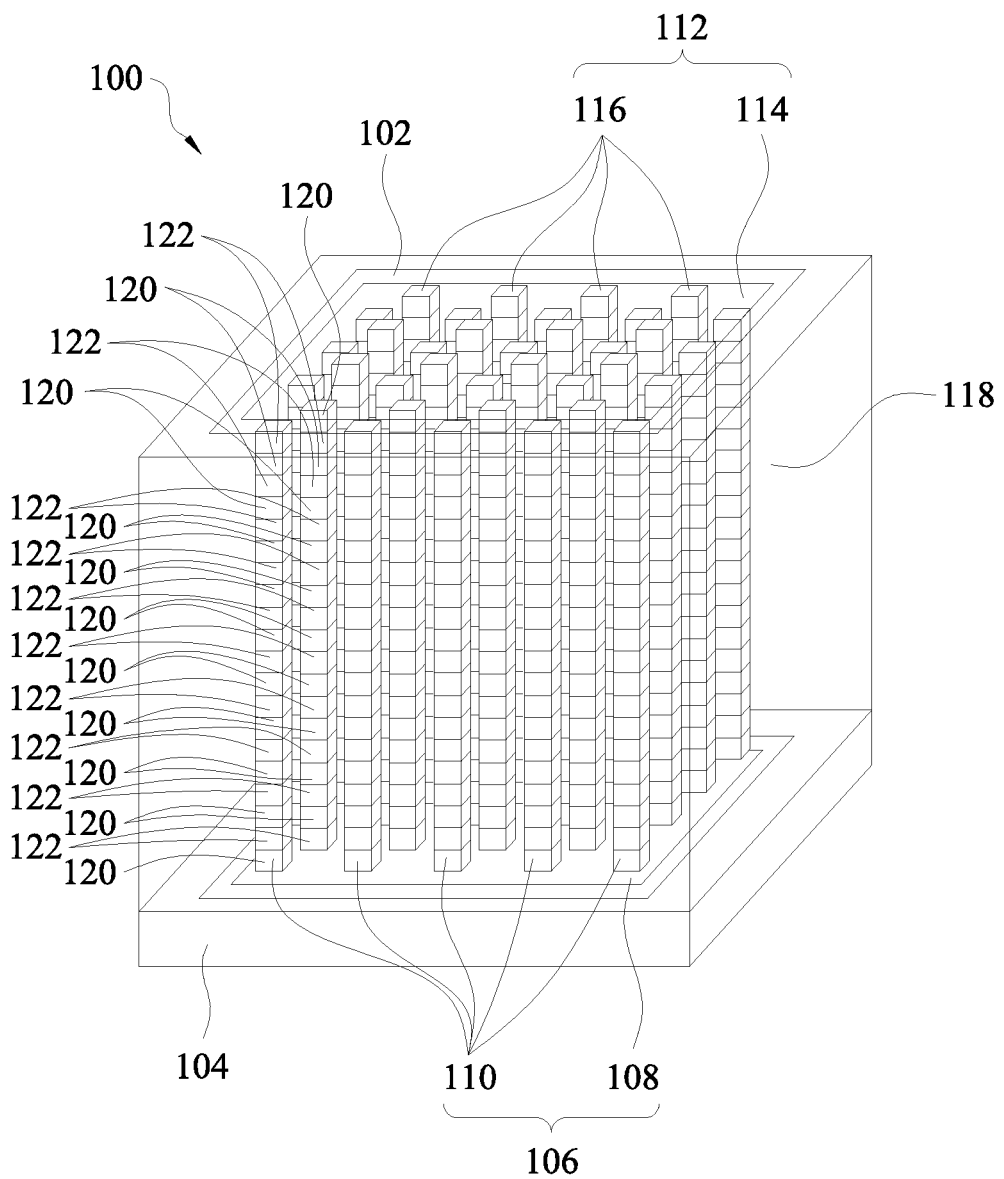
FIG. 1 illustrates a vertical capacitor in an integrated circuit in accordance with one or more embodiments.

Structures and methods for integrated circuit capacitors are provided. FIG. 1 illustrates a vertical capacitor in an integrated circuit in accordance with one or more embodiments. In FIG. 1, a capacitor 102 is shown on a substrate 104 in an integrated circuit 100. The capacitor 102 includes a first electrode 106. The first electrode 106 includes a bottom conductive plane 108 and first vertical conductive structures 110. The bottom conductive plane 108 is disposed over the substrate 104. The capacitor 102 also includes a second electrode 112. The second electrode 112 includes a top conductive plane 114 and second vertical conductive structures 116. The capacitor 102 includes an insulating structure 118 between the first electrode 106 and the second electrode 112. The first vertical conductive structures 110 and the second vertical conductive structures 116 are interlaced with each other.

The integrated circuit 100 can include active devices such as transistors (not shown) and any other devices formed on the substrate 104. The integrated circuit 100 can include many metallization layers, for example M1 through Mx, where the M1 layer is the bottom metallization layer, and layer Mx can be the top metallization layer. The letter "x" represents an integer greater than one. The bottom conductive plane 108 and/or the top conductive plane 114 can be formed in a metallization layer commonly used for the formation of interconnect structures in integrated circuits. In one example, the capacitor 102 can extend from metallization layer M1 to metallization layer Mx. The bottom conductive plane 108 can be in the bottom metallization layer M1 and the top conductive plane 114 can be in the top metallization layer Mx. In this embodiment, since the capacitor 102 can be fabricated simultaneously with other features of the integrated circuit 100, the manufacturing cost is relatively low. However, it is appreciated that the bottom conductive plane 108 and the top conductive plane 114 of the capacitor 102 can be in any of the metallization layers or in any other suitable layers. Also, the bottom conductive plane 108 and the top conductive plane 114 can comprise any other suitable conductive material other than metal.

The first vertical conductive structures 110 can include more than one metal layer 122 connected by via layers 120. Each metal layer 122 is formed in a metallization layer commonly used for the formation of interconnect structures in integrated circuits. The metal layers 122 and via layers 120 alternate each other. The second vertical conductive structures 116 also include many metal layers 122 and via layers 120 alternating with each other.

Metal features, such as the metal layers 122, can comprise copper, copper alloys, or any other suitable material. The metal features may be formed using damascene processes. The damascene process includes depositing a dielectric layer, etching the dielectric layer to form openings or trenches, filling the openings or trenches with metallic materials, and performing a chemical mechanical polish to remove excess material. The formation of the openings or trenches can involve ashing processes.

More particularly, a dual damascene process can be used. In a dual-damascene structure, only a single metal deposition step is used to simultaneously form main metal lines in the trenches and the metal in the vias. Thus, both the trenches and vias can be formed in a single dielectric layer. The vias and trenches can be defined by using two lithography steps. Trenches are typically etched to a depth of 4000-5000 Å, and the vias are typically 5000-7000 Å-deep. After the via and trench recesses are etched, the via is filled in the same metal-deposition step that fills the trench. After filling the vias and trenches, the excess metal deposited outside the trench is removed by a chemical mechanical planarization (CMP) process, and a planar structure with metal inlays is achieved.

The insulating structure 118 can include many inter-metal dielectric layers. In one embodiment, as the metal layers 122 and via layers 120 are formed, multiple inter-metal dielectric layers can be deposited and etched to form the insulating structure 118. In another embodiment, the k value of dielectric materials in the insulating structure 118 can be increased. In one example, a nitridation can be performed on the dielectric materials of the insulating structure 118 in the capacitor 102 to increase the dielectric constant k value of the dielectric materials. Accordingly, the k value of dielectric materials in the capacitor 102 can be greater than the k value of dielectric materials outside the capacitor 102. Outside the capacitor 102, the dielectric materials can have a low-k value, e.g. less than about 3.9, and even less than about 2.5 in other embodiments.

In another embodiment, the k value of dielectric materials in the capacitor 102 can be increased by the formation of OH terminations, which may be formed by treating the integrated circuit structure 100 in an $H_2O$ (for example, moisture) containing environment. The treatment is preferably a plasma treatment or a thermal treatment. Alternatively, a silane treatment is performed. In yet another embodiment, the k value of dielectric materials in the capacitor 102 can be increased by implanting species such as nitrogen, carbon, oxygen, and the like. In various embodiments, the resulting k value of dielectric materials in the capacitor 102 can be increased to values greater than about 2.0.

In various embodiments, the first vertical conductive structures 110 and the second vertical conductive structures 116 can have a square shape, a rectangular shape, a circular shape, an oval shape, any other suitable shape in a cross section, or any combinations thereof. The first vertical conductive structures 110 can be distributed uniformly on the bottom conductive plane 108. The second vertical conductive structures 116 can be distributed uniformly under the top conductive plane 114. Also, the first vertical conductive structures 110 can be distributed in a square grid pattern on the bottom conductive plane 108. And the second vertical conductive structures 116 can be distributed in a square grid pattern under the top conductive plane 114.

FIG. 2 illustrates an exemplary flow chart of a method for fabricating a capacitor in an integrated circuit in accordance with one or more embodiments. An exemplary method for forming a capacitor 102 includes forming the first electrode 106 of the capacitor 102 over the substrate 104 at the step 202 in FIG. 2. The first electrode 106 includes the bottom conductive plane 108 and the first vertical conductive structures 110 on the bottom conductive plane 108. At step 204, the insulating structure 118 is formed over the first electrode 106. At step 206, the second electrode 112 of the capacitor 102 is formed over the insulating structure 118. The second electrode 112 includes the top conductive plane 114 and the second vertical conductive structures 116 under the top conductive plane 114. The first vertical conductive structures 110 and the second vertical conductive structures 116 are interlaced with each other.

The step 202 of forming the first electrode 106 can include forming the bottom conductive plane 108 over the substrate 104. At least one first opening can be formed in a first dielectric layer of the insulating structure 118. A first metal layer can be deposited in the at least one first opening for forming at least a portion of the first vertical conductive structures 106. Further, a chemical mechanical planarization (CMP) process can be performed to the first metal layer.

The step 206 of forming the second electrode 112 can include forming at least one second opening in a second dielectric layer of the insulating structure 118. A second metal layer can be deposited in the at least one second opening for forming at least a portion of the second vertical conductive structures 116. The top conductive plane 114 can be formed over the second vertical conductive structures 116. Further, a CMP process can be performed to the second metal layer.

In addition, a third dielectric layer can be deposited between the first dielectric layer and the second dielectric layer. At least one third opening can be formed in the third dielectric layer. A third metal layer can be deposited in the at least one third opening for forming at least portions of both the first vertical conductive structures 110 and the second vertical conductive structures 116. Further, a CMP process can be performed to the third metal layer.

Different embodiments may have different advantages, including (1) higher capacitance density along the integrated circuit shrinkage trend, (2) less process variation due to better lithography process control compared to a layer thickness control for the conventional capacitor fabrication, (3) an easier interconnect routing for both of the electrodes 106 and 112 of the capacitor 102 compared to the complicated wiring for the conventional capacitors, and/or (4) easier adaptation to shrinking technology nodes, because horizontal dimensions shrink regularly across technology node generations, but vertical dimensions do not. The radio frequency modeling of the capacitor 102 can be also relatively simple for similar reasons. Even though this disclosure includes exemplary embodiments, a skilled person in the art will appreciate that there can be many embodiment variations of this disclosure.

Figure 3A:
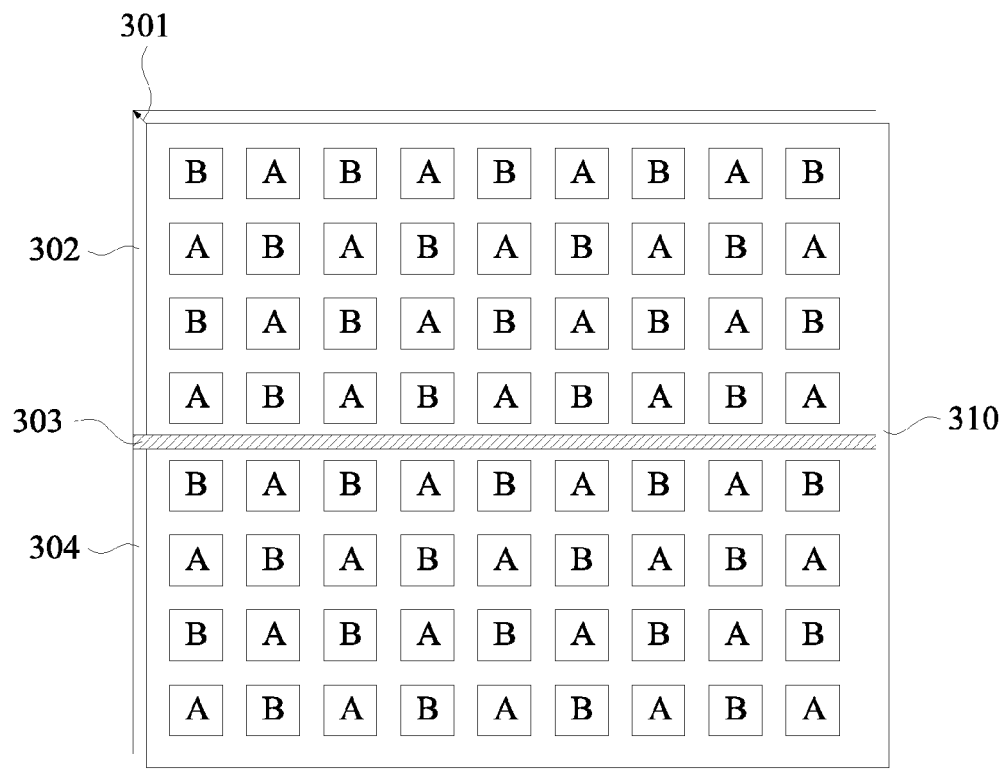
FIG. 3A is a top view of an exemplary capacitor structure with a divided top conductive plane of the vertical capacitor of FIG. 1 in accordance with one or more embodiments.

FIG. 3A is a top view of an exemplary capacitor structure with a divided top conductive plane of the vertical capacitor of FIG. 1 in accordance with one or more embodiments. There are two top conductive planes 302 and 304, and one bottom conductive plane 310. The top conductive planes 302 and 304 are displaced in FIG. 3A as indicated by an arrow 301 from the bottom conductive plane 310 for illustration clarity (to avoid overlapping each other). Similar displacement was used in top view figures below. A top conductive plane such as 114 in FIG. 1 is divided into two top conductive planes 302 and 304 in FIG. 3A. The first vertical conductive structures such as 110 in FIG. 1 connected to the bottom conductive plane 310 in FIG. 3A are denoted as structure "A" and the second vertical conductive structures such as 116 in FIG. 1 connected to the top conductive planes 302 and 304 in FIG. 3A are denoted as structure "B". The combined area of the two top conductive planes 302 and 304, and the gap area 303 between adjacent top conductive planes 302 and 304 has about the same area and shape as the bottom conductive plane 310 in some embodiments.

Figure 8A:
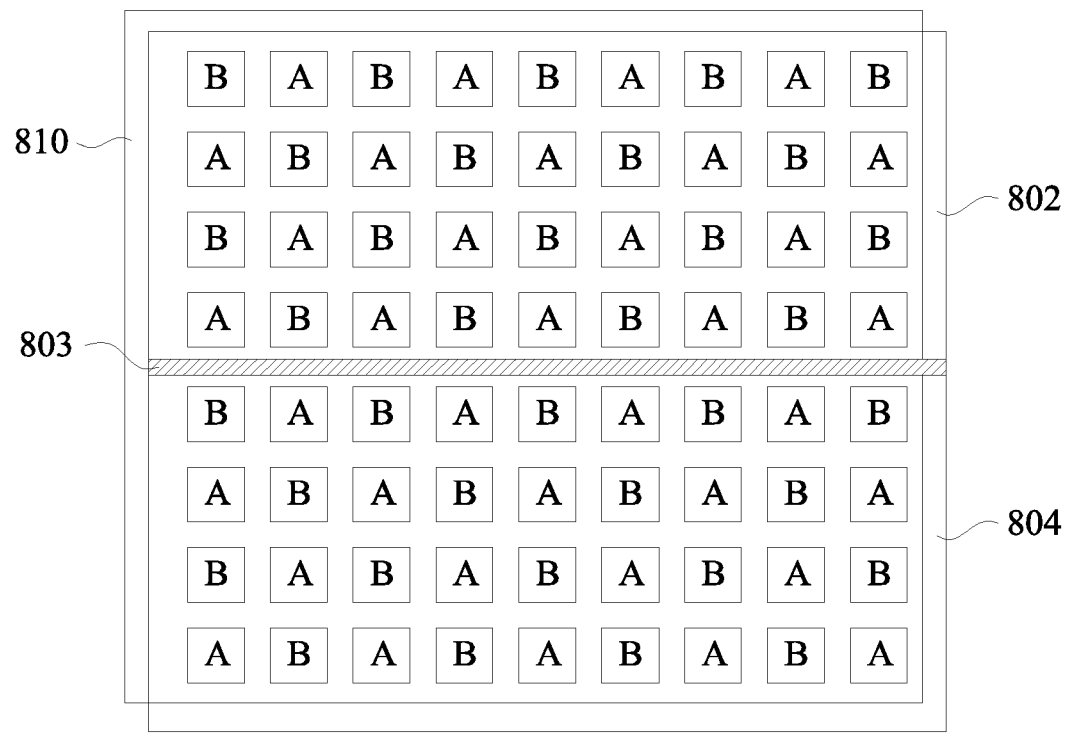
FIG. 8A is a top view of an exemplary capacitor structure with a divided bottom conductive plane of the vertical capacitor of FIG. 1 in accordance with one or more embodiments.

Even though there are two top conductive planes 302 and 304 in FIG. 3A, the number of top conductive planes can be three, four, or more. Also, the shapes of the divided top conductive planes are not limited to a rectangular shape as the top conductive planes 302 and 304. For example, the shape of the divided top conductive plane can be a square, zigzag, or other shapes. Further, instead of the top conductive plane divided into multiple top conductive planes, the bottom conductive plane 310 can be divided into multiple bottom conductive planes as shown in FIG. 8A.

Figure 3B:
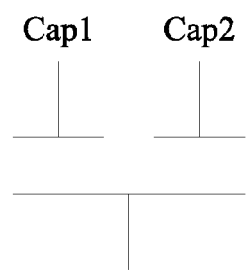
FIG. 3B is a symbolic representation of the capacitor structure of FIG. 3A in accordance with one or more embodiments.

FIG. 3B is a symbolic representation of the capacitor structure of FIG. 3A in accordance with one or more embodiments. The capacitors Cap1 and Cap2 are shown to have a common bottom connection. The capacitors Cap1 and Cap2 share the bottom conductive plane 310 and have separate top conductive planes 302 and 304 in FIG. 3A respectively. Since the first vertical conductive structures A connected to the bottom conductive plane 310 and the second vertical conductive structures B connected to the top conductive plane 302 and 304 are arranged in a symmetric and repeated pattern, the capacitance ratios of divided capacitors Cap1 and Cap2 can be estimated based on the area division and numbers of associated vertical conductive structures A and B in some embodiments.

For applications where accurate ratio of capacitances is desired, the capacitor structure in FIG. 3A provides a convenient capacitor structure since the ratio of the capacitances can be related to the area division and numbers of associated vertical conductive structures A and B. Also, variance of capacitance values from process variations can be reduced compared to separate capacitors fabricated at separate locations in the integrated circuit.

Figure 4A:
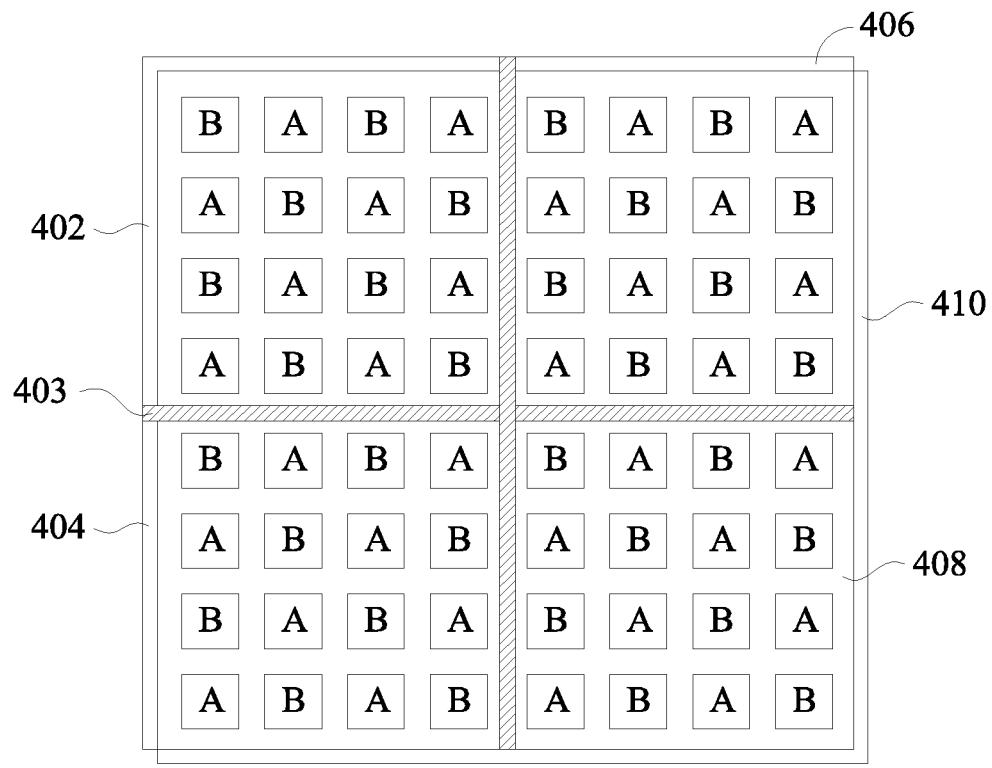
FIG. 4A is a top view of another exemplary capacitor structure with a divided top conductive plane of the vertical capacitor of FIG. 1 in accordance with one or more embodiments.

FIG. 4A is a top view of another exemplary capacitor structure with a divided top conductive plane of the vertical capacitor of FIG. 1 in accordance with one or more embodiments. There are four top conductive planes 402, 404, 406, and 408, and one bottom conductive plane 410. A top conductive plane such as 114 in FIG. 1 is divided into the four top conductive planes 402, 404, 406, and 408 in FIG. 4A.

The first vertical conductive structures such as 110 in FIG. 1 connected to the bottom conductive plane 410 in FIG. 4A are denoted as structure "A" and the second vertical conductive structures such as 116 in FIG. 1 connected to the top conductive planes 402, 404, 406, and 408 in FIG. 4A are denoted as structure "B". The combined area of the four top conductive planes 402, 404, 406, and 408, and the gap area 403 between adjacent top conductive planes 402, 404, 406, and 408 has about the same area and shape as the bottom conductive plane 410 in some embodiments.

Figure 4B:
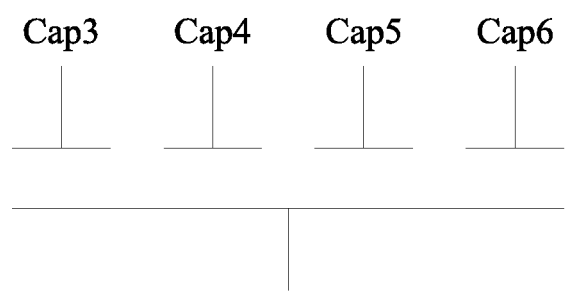
FIG. 4B is a symbolic representation of the capacitor structure of FIG. 4A in accordance with one or more embodiments.

FIG. 4B is a symbolic representation of the capacitor structure of FIG. 4A in accordance with one or more embodiments. The capacitors Cap3, Cap4, Cap5, and Cap6 are shown to have a common bottom connection. The capacitors Cap3, Cap4, Cap5, and Cap6 share the bottom conductive plane 410 and have separate top conductive planes 402, 404, 406, and 408 in FIG. 4A respectively. Since the first vertical conductive structures A connected to the bottom conductive plane 410 and the second vertical conductive structures B connected to the top conductive planes 402, 404, 406, and 408 are arranged in a symmetric and repeated pattern, the capacitance ratios of divided capacitors Cap3, Cap4, Cap5, and Cap6 can be estimated based on the area division and numbers of associated vertical conductive structures A and B in some embodiments.

Figure 5A:
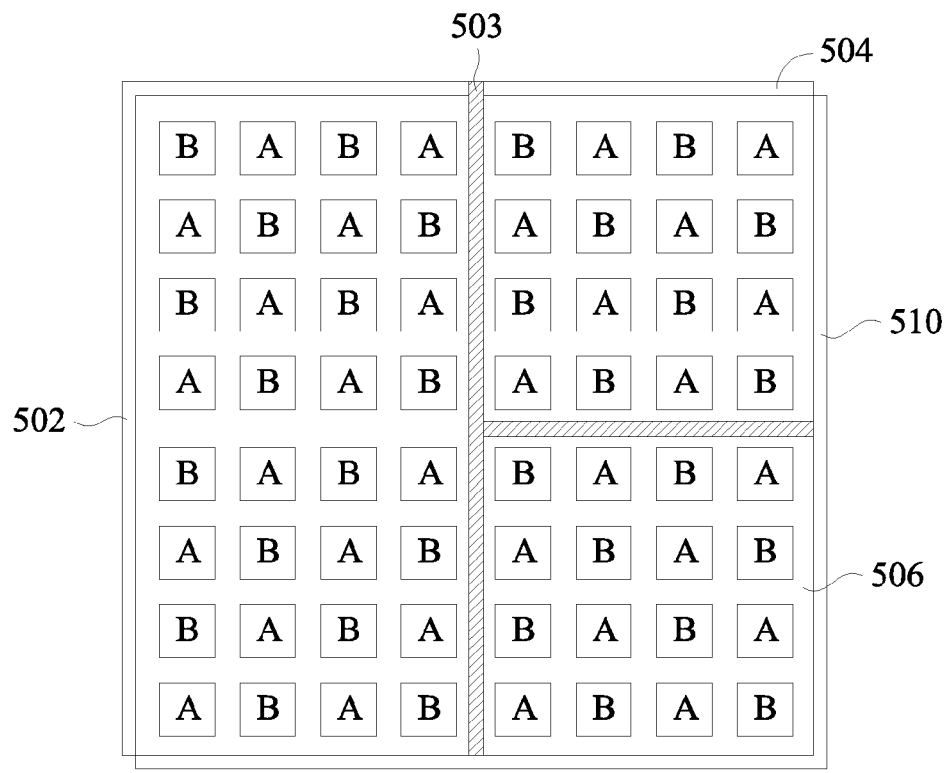
FIG. 5A is a top view of yet another exemplary capacitor structure with a divided top conductive plane of the vertical capacitor of FIG. 1 in accordance with one or more embodiments.

FIG. 5A is a top view of yet another exemplary capacitor structure with a divided top conductive plane of the vertical capacitor of FIG. 1 in accordance with one or more embodiments. There are three top conductive planes 502, 504, and 506 and one bottom conductive plane 510. Instead of dividing a top conductive plane in the same metal layer such as 114 in FIG. 1 into three top conductive planes, the top conductive planes 502, 504, and 506 in FIG. 5A are formed in different metal layers. The first vertical conductive structures such as 110 in FIG. 1 connected to the bottom conductive plane 510 in FIG. 3A are denoted as structure "A" and the second vertical conductive structures such as 116 in FIG. 1 connected to the top conductive planes 502, 504, and 506 in FIG. 5A are denoted as structure "B".

Figure 5B:
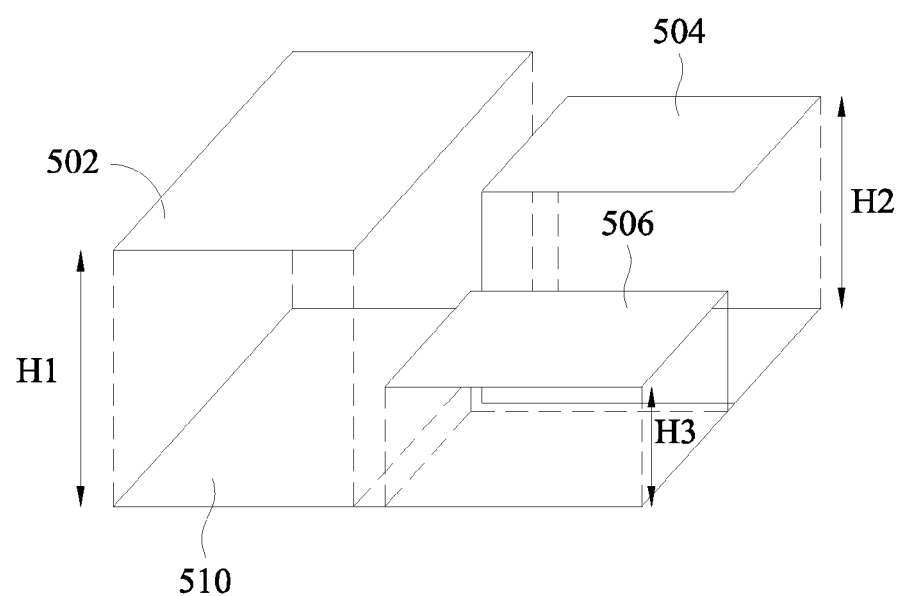
FIG. 5B is a perspective diagram of the capacitor structure of FIG. 5A in accordance with one or more embodiments.

FIG. 5B is a perspective diagram of the capacitor structure of FIG. 5A in accordance with one or more embodiments to show the different layers of the top conductive planes 502, 504, and 506. The vertical conductive structures A and B (110 and 116 in FIG. 1) are not shown for simplicity. For example, the bottom conductive plane 510 can be formed in the first metal layer M1, the top conductive plane 502 can be formed in the tenth metal layer M10, the top conductive plane 504 can be formed in the eighth metal layer M8, the top conductive plane 506 can be formed in the fifth metal layer M5.

The heights of the top conductive planes 502, 504, and 506 from the bottom conductive plane 510 are different as indicted by H1, H2, and H3 respectively. The heights of the vertical conductive structures A and B associated with the top conductive planes 502, 504, and 506 are also different. The capacitance ratios of divided capacitors are dependent not only on the area division and numbers of associated vertical conductive structures A and B, but also the height of the top conductive planes 502, 504, and 506. The combined area of the three top conductive planes 502, 504, and 506, and the gap area 503 between adjacent top conductive planes 502, 504, and 506 has about the same area and shape as the bottom conductive plane 510 in some embodiments.

Figure 6:
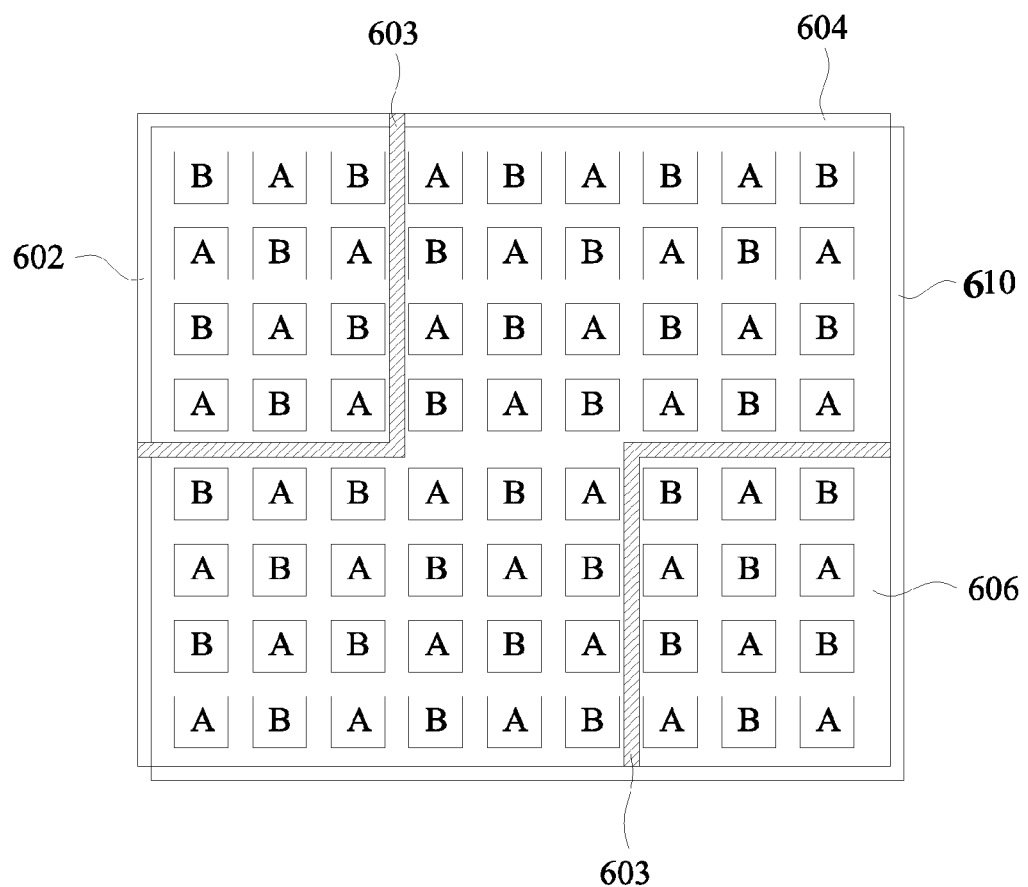
FIG. 6 is a top view of yet another exemplary capacitor structure with a divided top conductive plane of the vertical capacitor of FIG. 1 in accordance with one or more embodiments.

FIG. 6 is a top view of yet another exemplary capacitor structure with a divided top conductive plane of the vertical capacitor of FIG. 1 in accordance with one or more embodiments. There are three top conductive planes 602, 604, and 606 and one bottom conductive plane 610. A top conductive plane such as 114 in FIG. 1 is divided into the three top conductive planes 602, 604, and 606 in FIG. 6.

The first vertical conductive structures such as 110 in FIG. 1 connected to the bottom conductive plane 610 in FIG. 6 are denoted as structure "A" and the second vertical conductive structures such as 116 in FIG. 1 connected to the top conductive planes 602, 604, and 606 in FIG. 6 are denoted as structure "B". The combined area of the four top conductive planes 602, 604, and 606, and the gap area 603 between adjacent top conductive planes 602, 604, and 606 has about the same area and shape as the bottom conductive plane 610 in some embodiments.

The shapes of the top conductive planes 602 and 606 are rectangular, but the shape of the top conductive plane 604 is irregular. Since the first vertical conductive structures A connected to the top conductive planes 602, 604, and 606, and the second vertical conductive structures B are arranged in a symmetric and repeated pattern, the capacitance ratios of divided capacitors associated with the top conductive planes 602, 604, and 606 can be estimated based on the area division and numbers of associated vertical conductive structures A and B in some embodiments.

FIG. 7 is an exemplary flow chart of a method for fabricating the capacitor structure in FIG. 3A in accordance with one or more embodiments. At operation 702, a first electrode is formed over a substrate (such as 104 in FIG. 1). The first electrode includes a bottom conductive plane (such as 310 in FIG. 3A) and first vertical conductive structures ("A" in FIG. 3A and 110 in FIG. 1) on the bottom conductive plane, and the bottom conductive plane has a first area and a first shape (e.g., rectangular in FIG. 3A). The fabrication process can use any suitable processes known in the art, and can be similar to the exemplary processes described above with respect to FIG. 2.

At operation 704, an insulating structure (such as 118 in FIG. 1) is formed over the first electrode. The fabrication process can use any suitable processes known in the art, and can be similar to the exemplary processes described above with respect to FIG. 2.

At operation 706, at least two second electrodes are formed over the insulating structure. The at least two second electrodes include at least two top conductive planes (such as 302 and 304 in FIG. 3A) and second vertical conductive structures ("B" in FIG. 3A and 116 in FIG. 1) under the at least two top conductive planes. A combined area of the top conductive planes and a gap area between adjacent top conductive planes has a second area and a second shape (e.g., rectangular in FIG. 3A). The first area and the second area are about the same and the first shape and the second shape are about the same. The first vertical conductive structures and the second vertical conductive structures are interlaced with each other. The fabrication process can use any suitable processes known in the art, and can be similar to the exemplary processes described above with respect to FIG. 2

FIG. 8A is a top view of an exemplary capacitor structure with a divided bottom conductive plane of the vertical capacitor of FIG. 1 in accordance with one or more embodiments. There are two bottom conductive planes 802 and 804, and one top conductive plane 810. A bottom conductive plane such as 108 in FIG. 1 is divided into two bottom conductive planes 802 and 804 in FIG. 8A. The first vertical conductive structures such as 110 in FIG. 1 connected to the bottom conductive planes 802 and 804 in FIG. 8A are denoted as structure "A" and the second vertical conductive structures such as 116 in FIG. 1 connected to the top conductive planes 810 in FIG. 8A are denoted as structure "B". The combined area of the two bottom conductive planes 802 and 804, and the gap area 803 between adjacent bottom conductive planes 802 and 804 has about the same area and shape as the top conductive plane 810 in some embodiments.

Even though there are two bottom conductive planes 802 and 804 in FIG. 8A, the number of bottom conductive planes can be three, four, or more in other embodiments. Also, the shapes of division of the bottom conductive planes are not limited to a rectangular shape as the bottom conductive planes 802 and 804. For example, the shape of the divided bottom conductive plane can be a square, zigzag, or other shapes.

Figure 8B:
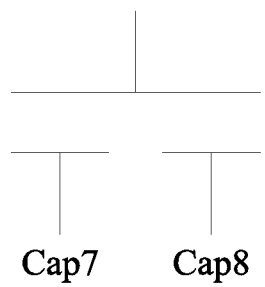
FIG. 8B is a symbolic representation of the capacitor structure of FIG. 8A in accordance with one or more embodiments.

FIG. 8B is a symbolic representation of the capacitor structure of FIG. 8A in accordance with one or more embodiments. The capacitors Cap7 and Cap8 are shown to have a common top connection. The capacitors Cap7 and Cap8 share the top conductive plane 810 and have separate bottom conductive planes 802 and 804 in FIG. 8A respectively. Since the first vertical conductive structures A connected to the bottom conductive plane 802 and 804 and the second vertical conductive structures B connected to the top conductive plane 810 are arranged in a symmetric and repeated pattern, the capacitance ratio of divided capacitors Cap7 and Cap8 can be estimated based on the area division and numbers of associated vertical conductive structures A and B.

For applications where accurate ratio of capacitances is desired, the capacitor structure in FIG. 8A provides a convenient capacitor structure since the ratio of the capacitances can be related to the area division and numbers of associated vertical conductive structures A and B. Also, variance of capacitance values from process variations can be reduced compared to separate capacitors fabricated at separate locations in the integrated circuit.

FIG. 9 is an exemplary flow chart of a method for fabricating the capacitor structure in FIG. 8A in accordance with one or more embodiments. At operation 902, at least two first electrodes are formed over a substrate (such as 104 in FIG. 1). The at least two first electrodes include at least two bottom conductive planes (such as 802 and 804 in FIG. 8A) and first vertical conductive structures ("A" in FIG. 8A and 110 in FIG. 1) on the at least two bottom conductive planes. A combined area of the bottom conductive planes and a gap area between adjacent bottom conductive planes has a first area and a first shape (e.g., rectangular in FIG. 8A). The fabrication process can use any suitable processes known in the art, and can be similar to the exemplary processes described above with respect to FIG. 2.

At operation 904, an insulating structure (such as 118 in FIG. 1) is formed over the first electrodes. The fabrication process can use any suitable processes known in the art, and can be similar to the exemplary processes described above with respect to FIG. 2.

At operation 906, a second electrode is formed over an insulating structure (such as 118 in FIG. 1). The second electrode includes a top conductive plane (such as 810 in FIG. 8A) and second vertical conductive structures ("B" in FIG. 8A and 116 in FIG. 1) under the top conductive plane, and the top conductive plane has a second area and a second shape (e.g., rectangular in FIG. 8A). The first area and the second area are about the same and the first shape and the second shape are about the same. The first vertical conductive structures and the second vertical conductive structures are interlaced with each other. The fabrication process can use any suitable processes known in the art, and can be similar to the exemplary processes described above with respect to FIG. 2

According to some embodiments, a capacitor structure includes at least two capacitors. A first electrode includes a bottom conductive plane and first vertical conductive structures. The bottom conductive plane is disposed over a substrate. The bottom conductive plane has a first area and a first shape. At least two second electrodes include top conductive planes and second vertical conductive structures. A combined area of the top conductive planes and a gap area between adjacent top conductive planes has a second area and a second shape. The first area and the second area are about the same and the first shape and the second shape are about the same. An insulating structure is disposed between the first electrode and the second electrodes. The first vertical conductive structures and the second vertical conductive structures are interlaced with each other. The capacitors share the bottom conductive plane and have separate top conductive planes.

According to some embodiments, a method of forming a capacitor structure includes forming a first electrode of the capacitor over a substrate. The first electrode includes a bottom conductive plane and a plurality of first vertical conductive structures on the bottom conductive plane. The bottom conductive plane has a first area and a first shape. An insulating structure is formed over the first electrode. At least two second electrodes are formed over the insulating structure. The at least two second electrodes include at least two top conductive planes and a plurality of second vertical conductive structures under the at least two top conductive planes. A combined area of the at least two top conductive planes and a gap area between adjacent top conductive planes of the at least two top conductive planes has a second area and a second shape. The first area and the second area are about the same and the first shape and the second shape are about the same. The plurality of first vertical conductive structures and the plurality of second vertical conductive structures are interlaced with each other.

According to some embodiments, a capacitor structure includes at least two capacitors. At least two first electrodes include at least two bottom conductive planes and a plurality of first vertical conductive structures. The bottom conductive plane is disposed over a substrate. A combined area of the at least two bottom conductive planes and a gap area between adjacent bottom conductive planes of the at least two bottom conductive planes has a first area and a first shape. A second electrode includes a top conductive plane and a plurality of second vertical conductive structures under the top conductive plane. The top conductive plane has a second area and a second shape. The first area and the second area are about the same and the first shape and the second shape are about the same. An insulating structure is disposed between the at least two first electrodes and the second electrode. The plurality of first vertical conductive structures and the plurality of second vertical conductive structures are interlaced with each other. The at least two capacitors have separate bottom conductive planes and share the top conductive plane.

Although the present disclosure and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A capacitor structure including at least two capacitors, comprising:
    a first electrode including a bottom conductive plane and a plurality of first vertical conductive structures on the bottom conductive plane, the bottom conductive plane being disposed over a substrate, wherein the bottom conductive plane has a first area and a first shape;
    at least two second electrodes including at least two top conductive planes and a plurality of second vertical conductive structures under the at least two top conductive planes, wherein a combined area of the at least two top conductive planes and a gap area between adjacent top conductive planes of the at least two top conductive planes has a second area and a second shape, the first area and the second area are about the same and the first shape and the second shape are about the same; and
    an insulating structure between the first electrode and the at least two second electrodes,
    wherein the plurality of first vertical conductive structures and the plurality of second vertical conductive structures are interlaced with each other, and the at least two capacitors share the bottom conductive plane and have separate top conductive planes.

2. The capacitor structure of claim 1, wherein the plurality of first vertical conductive structures comprise a plurality of first metal layers and a plurality of first via layers alternating with each other, and the plurality of second vertical conductive structures comprise a plurality of second metal layers and a plurality of second via layers alternating with each other.

3. The capacitor structure of claim 1, wherein the insulating structure includes a plurality of inter-metal dielectric layers.

4. The capacitor structure of claim 1, wherein the plurality of first vertical conductive structures and the plurality of second vertical conductive structures have at least one cross-sectional shape selected from the group consisting of a square shape, a rectangular shape, a circular shape, and an oval shape.

5. The capacitor structure of claim 1, wherein the plurality of first vertical conductive structures are distributed uniformly on the bottom conductive plane, and the plurality of second vertical conductive structures are distributed uniformly under the at least two top conductive planes.

6. The capacitor structure of claim 1, wherein the plurality of first vertical conductive structures are distributed in a square grid pattern on the bottom conductive plane, and the plurality of second vertical conductive structures are distributed in a square grid pattern under the at least two top conductive planes.

7. The capacitor structure of claim 1, wherein a portion of the insulating structure is positioned between the first vertical conductive structures and the second vertical conductive structures, the insulating structure comprises another portion different from the portion between the first vertical conductive structures and the second vertical conductive structures, the portion between the first vertical conductive structures and the second vertical conductive structures comprises a material having a dielectric constant value greater than a dielectric constant value of the another portion of the insulating structure.

8. A method of forming a capacitor structure, comprising:
    forming a first electrode over a substrate, wherein the first electrode includes a bottom conductive plane and a plurality of first vertical conductive structures on the bottom conductive plane, and the bottom conductive plane has a first area and a first shape;
    forming an insulating structure over the first electrode; and
    forming at least two second electrodes over the insulating structure, wherein the at least two second electrodes include at least two top conductive planes and a plurality of second vertical conductive structures under the at least two top conductive planes, wherein a combined area of the at least two top conductive planes and a gap area between adjacent top conductive planes of the at least two top conductive planes has a second area and a second shape, the first area and the second area are about the same and the first shape and the second shape are about the same, and the plurality of first vertical conductive structures and the plurality of second vertical conductive structures are interlaced with each other.

9. The method of claim 8, wherein forming the first electrode comprises:
   forming the bottom conductive plane over the substrate;
   forming at least one first opening in a first dielectric layer of the insulating structure; and
   depositing a first metal layer in the at least one first opening for forming at least a portion of the plurality of first vertical conductive structures.

10. The method of claim 9, wherein forming the first electrode further comprises performing a chemical mechanical planarization to the first metal layer.

11. The method of claim 9, wherein forming the at least two second electrodes comprises:
    forming at least one second opening in a second dielectric layer of the insulating structure;
    depositing a second metal layer in the at least one second opening for forming at least a portion of the plurality of second vertical conductive structures; and
    forming the at least two top conductive planes over the plurality of second vertical conductive structures.

12. The method of claim 11, wherein forming the at least two second electrodes further comprises performing a chemical mechanical planarization to the second metal layer.

13. The method of claim 11, further comprising:
    depositing a third dielectric layer between the first dielectric layer and the second dielectric layer;
    forming at least one third opening in the third dielectric layer; and
    depositing a third metal layer in the at least one third opening for forming at least portions of both the plurality of first vertical conductive structures and the plurality of second vertical conductive structures.

14. The method of claim 13, further comprising performing a chemical mechanical planarization to the third metal layer.

15. The method of claim 8, wherein the plurality of first vertical conductive structures and the plurality of second vertical conductive structures have at least one cross-sectional shape selected from the group consisting of a square shape, a rectangular shape, a circular shape, and an oval shape.

16. The method of claim 8, wherein the plurality of first vertical conductive structures are distributed in a square grid pattern on the bottom conductive plane, and the plurality of second vertical conductive structures are distributed in a square grid pattern under the at least two top conductive planes.

17. A capacitor structure including at least two capacitors, comprising:
    at least two first electrodes including at least two bottom conductive planes and a plurality of first vertical conductive structures, the bottom conductive plane being disposed over a substrate, wherein a combined area of the at least two bottom conductive planes and a gap area between adjacent bottom conductive planes of the at least two bottom conductive planes has a first area and a first shape;
    a second electrode including a top conductive plane and a plurality of second vertical conductive structures under the top conductive plane, wherein the top conductive plane has a second area and a second shape, the first area and the second area are about the same and the first shape and the second shape are about the same; and
    an insulating structure between the at least two first electrodes and the second electrode,
    wherein the plurality of first vertical conductive structures and the plurality of second vertical conductive structures are interlaced with each other, and the at least two capacitors have separate bottom conductive planes and share the top conductive plane.

18. The capacitor structure of claim 17, wherein the plurality of first vertical conductive structures comprise a plurality of first metal layers and a plurality of first via layers alternating with each other, and the plurality of second vertical conductive structures comprise a plurality of second metal layers and a plurality of second via layers alternating with each other.

19. The capacitor structure of claim 18, wherein the insulating structure includes a plurality of inter-metal dielectric layers.

20. The capacitor structure of claim 18, wherein the plurality of first vertical conductive structures are distributed uniformly on the at least two bottom conductive planes, and the plurality of second vertical conductive structures are distributed uniformly under the top conductive plane.

* * * * *